(12) United States Patent
Denk et al.

(10) Patent No.: US 6,556,954 B1
(45) Date of Patent: Apr. 29, 2003

(54) METHOD AND DEVICE FOR DETERMINING A FAULT IN A TECHNICAL SYSTEM

(75) Inventors: Georg Denk, Rosenheim (DE); Oliver Schein, Dietzenbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/646,500

(22) PCT Filed: Jan. 29, 1999

(86) PCT No.: PCT/DE99/00239
§ 371 (c)(1),
(2), (4) Date: Sep. 18, 2000

(87) PCT Pub. No.: WO99/48030
PCT Pub. Date: Sep. 23, 1999

(30) Foreign Application Priority Data

Mar. 18, 1998 (DE) .......................... 198 11 860

(51) Int. Cl.⁷ .............................. G06F 7/62; G06F 17/50

(52) U.S. Cl. ............................. 702/185; 716/4; 703/13

(58) Field of Search ................................ 702/185, 117; 716/4; 703/2, 13, 14; 324/500, 649

(56) References Cited

U.S. PATENT DOCUMENTS

| | | | |
|---|---|---|---|
| 5,132,897 A | | 7/1992 | Allenberg |
| 5,537,329 A | * | 7/1996 | Feldmann et al. ............. 716/4 |
| 5,646,869 A | | 7/1997 | Kaneko et al. |
| 6,072,947 A | * | 6/2000 | Roychowdhury et al. ..... 703/14 |
| 6,135,649 A | * | 10/2000 | Feldmann et al. ............ 703/14 |
| 6,154,716 A | * | 11/2000 | Lee ............................. 703/14 |
| 6,182,270 B1 | * | 1/2001 | Feldmann et al. ............ 703/14 |

OTHER PUBLICATIONS

Ham et al., "Complete Noise Analysis for CMOS Switching Mixers Via Stochastic Differential Equations", IEEE, 2000.*

A.F. Schwarz, "Computer–Aided Design of Microelectronic Circuits and Systems", Fundamentals, Methods and Tools, vol. 1, (1987), pp. 184–189.

Alper Demir et al., "Three–Domain Non–Monte Carlo Noise Simulation for Nonlinear Dynamic Circuits with Arbitrary Excitations", IEEE Transactions on Computer–Aided Design of Integrated Circuits and Systems, vol. 15, No. 5, (1996), pp.493–505.

(List continued on next page.)

*Primary Examiner*—Patrick Assouad
(74) *Attorney, Agent, or Firm*—Morrison & Foerster LLP

(57) ABSTRACT

A technical system that is subject to a malfunction is described with an implicit stochastic differential equation system. An approximative solution of the system is determined in that a discrete approximation process is realized. The discrete approximation process is realized according to the following rule:

$$-(C+h\alpha_2 G)\cdot \tilde{X}_{\tau_{n+1}} = \{-(1-\gamma)C+h(1+\gamma\alpha_1-\alpha_2)G\}\cdot \tilde{X}_{\tau_n}$$
$$+\{-\gamma C+h(\gamma-\alpha_1\gamma)G\}\cdot \tilde{X}_{\tau_{n-1}}$$
$$+h\alpha_2 s(\tau_{n+1})+h(1+\gamma\alpha_1-\alpha_2)s(\tau_n)+$$
$$+h(\gamma-\alpha_1\gamma)s(\tau_{n-1})+$$
$$+B(\tau_n)\cdot \Delta W_n+\gamma B(\tau_n)\cdot \Delta W_{n-1}$$

The disturbance $\tilde{X}_{\tau_{n+1}}$ is determined by iterative solution of the approximation process.

24 Claims, 3 Drawing Sheets

OTHER PUBLICATIONS

B. Leimkuhler et al., "Approximation Methods for the Consistent Initialization of Differential–Algebraic Equations", (1991) Society for Industrial and Applied Mathematics, vol. 15, No. 1, pp. 205–226.

Leon O. Chua, "Computer–Aided Analysis of Electronic Circuits", Algorithms and Computational Techniques, (1975), p. 596.

Laurence W. Nagel, "SPICE2—A Computer Program to Simulate Semiconductor Circuits", Tech Report, UC Berkeley, memo ERL–M 520, (1975), Appendix 3, 1–37.

Peter E. Kloeden et al., "Numerical Solution of Stochastic Differential Equations", Springer–Verlag, Berlin, New York, ISBN 3–540–54062–8, (1992), p. 412.

G. Denk, et al., "Adams Methods for the Efficient Solution of Stochastic Differential Equations with Additive Noise", Computing, (1997), vol. 59, No. 2, pp. 153–161.

Alper Demir et al., "Time–Domain Non–Monte Carlo Noise Simulation of Nonlinear Dynamic Circuits with Arbitrary Excitations", IEEE/ACM International Conference on Computer–Aided Design, Digest Technical Papers, (1994), pp. 598–603.

Y. V. Mamontov, et al, "Model for Thermal Noise in Semiconductor Bipolar Transistors at Low–Current Operation as Multidimensional Diffusion Stochastic Process", IEICE Transactions on Electronics, (1997), pp. 1025–1042.

O. Schein, et al., "Numerical Solution of Stochastic Differential–Algebraic Equations with Applications to Transient Noise Simulation of Microelectronic Circuits", Journal of Computational and Applied Mathematics, (1998), vol. 100, No. 1, pp.77–92.

\* cited by examiner

METHOD AND DEVICE FOR DETERMINING A FAULT IN A TECHNICAL SYSTEM

BACKGROUND OF THE INVENTION

1. Field of the Invention

The invention relates to a method and apparatus for determining a malfunction of a technical system that is subject to a malfunction.

2. Description of the Related Art

The numerical simulation of electrical circuits has become of great significance in the development of computer chips in recent years. Simulators have become indispensable due to the high costs of producing a specimen chip and of possible redesign. With simulators it is possible to obtain predictive statements about operating behavior and efficiency of the modeled circuit on a computer. After successful simulation results, a chip is usually burned in silicon.

Using a "Network" approach, a circuit is described by its topological properties, the characteristic equations of circuit elements, and the Kirchhoff rules.

A modified, node analysis known from A. F. Schwarz, Computer-Aided design of microelectronic circuits and systems, vol. 1, Academic Press, London, ISBN 0-12-632431-A, pp. 185-188, 1987 ("Schwarz") may be utilized for the analysis of a circuit. This leads to a differential-algebraic equation system having the form $$C(x(t)) \cdot \dot{x}(t) + f(x(t)) + s(t) = 0. \tag{1}$$

A differential-algebraic equation system is an equation system of the type $$F(\dot{x}(t), x(t), t) = 0 \tag{2}$$

with a singular Jacobi matrix $F \cdot \dot{x}$ of the partial derivations of F according to $\dot{x}(t)$.

The differential-algebraic equation system (1) is also called a quasi linear-implicit equation system. $\dot{x}(t)$ indicates a curve of node voltages dependent on a time t, $\dot{x}(t)$ indicates its derivative according to the time t. $f(x(t))$ references a first predetermined function that contains conductance values and non-linear elements, $C(x(t))$ references a predetermined capacitance matrix and $s(t)$ references a second predetermined function that contains independent voltage sources and current sources.

Equation (1) describes only the ideal case for a circuit. In practice, however, noise, i.e., a malfunction of the circuit, cannot be avoided. "Noise" is defined here as an unwanted signal disturbance that is caused, for example, by thermal effects or the discrete structure of the elementary charge. Due to the increasing integration density of integrated circuits, the significance of the predictive analysis of such effects (noise simulation) is increasing.

In the analysis of a circuit taking noise into consideration, Equation (1) can be modeled as:

$$C(x(t)) \cdot \dot{x}(t) + f(x(t)) + s(t) + B(t, x(t)) \cdot v(\omega, t) = 0. \tag{3}$$

where $v(\omega, t)$, references an m-dimensional vector whose independent components are generalized white noise, where m indicates the number of noise current sources. A matrix $B(t, x(t))$, also referred to as intensity matrix has the dimension n×m. When only thermal noise in linear resistors occurs, then it is constant.

When the circuit is modelled with purely linear elements, then rule (3) becomes a disturbed, linear-implicit differential-algebraic equation system having the form $$C \cdot \dot{x}(t) + G \cdot x(t) + s(t) + B(t, x(t)) \cdot v(\omega, t) = 0. \tag{4}$$

What is to be understood by the term "index" below is a criterion regarding how far a differential-algebraic equation system "differs" from an explicit, ordinary differential equation system, how many derivation steps are required in order to obtain an explicit, ordinary differential equation system from the differential-algebraic equation system.

Without limitation of the universal validity and given existence of various term definitions of the term "index", the following definition is employed below for an index of a differential-algebraic equation system:

Let a differential-algebraic equation system of the type $$F(\dot{x}(t), x(t), t) = 0 \tag{2}$$

be given. When a lowest natural number i exists, so that the equations $$F(\dot{x}(t), x(t), t) = 0, \tag{5}$$

$$\frac{dF(\dot{x}(t), x(t), t)}{dt} = 0, \tag{6}$$

$$\vdots ,$$

$$\frac{d^{(i)} F(\dot{x}(t), x(t), t)}{dt^{(i)}} = 0 \tag{7}$$

can be transformed into a system of explicit ordinary differential equations, then 'i' is referred to as the index of the differential-algebraic equation system. The function F is thereby assumed to be capable of being differentiated an adequate number of times.

A "stochastic differential equation system" is defined by the following differential equation system:

Let a Wiener-Hopf process $\{W_t; t \in R_0^+\}$ be given on a probability space $(\Omega, A, P)$ together with a canonic filtration $\{C_s; s \in [a, b]\}$. Additionally h and G be: $[a, b] \times R \to R$ two $((B_{[a,b]} \times B)-B)$-measurable random variables and $\tilde{X}: \Omega \to R$ a $(C_a-B)$-measurable function. A stochastic differential equation system is established by the Itô differential $$X_s: \Omega \to R,$$

$$\omega \mapsto \tilde{X}(\omega) + \int_{[a,s]} h(u, X_u(\omega)) d\lambda(u) + \left( \int_a^s G(u, X_u) dW_u \right)(\omega) \tag{8}$$

or, symbolically, $$dX_s = h(s, X_s) ds + G(s, X_s) dW_s, \, s \in [a, b]; \, X_a = \tilde{X}. \tag{9}$$

The following method for noise simulation is known from A. Demir et al. Time-domain non-Monte Carlo noise simulation for nonlinear dynamic circuits with arbitrary excitations, IEEE Transactions on Computer-Aided Design of Integrated Circuits and System, Vol. 15, No. 5, pp.493–505, May 1996 ("Demir")

For the case of a purely additive disturbance, rule (4) can be decoupled into a differential and an algebraic part.

The following applies in the case of a purely additive disturbance:

$$B(t, x(t)) = B(t), \tag{10}$$

i.e., the intensity matrix is only dependent on the time t.

(4) thus becomes $$C \cdot \dot{x}(t) + G \cdot x(t) + s(t) + \tilde{B}(t) \cdot v(\omega, t) = 0. \tag{11}$$

Given the assumptions that consistent starting values ($x_{det}(t_0)$, $\dot{x}_{det}(t_0)$) are established at a starting time to and given regularity of the matrix brush $\{\lambda C + G; \lambda \in \mathbb{C}\}$, an unambiguous solution $x_{det}$ for (1) exists in the form $$C \cdot \dot{x}_{det} + G \cdot x_{det} + s = 0. \tag{12}$$

A matrix brush $\{\lambda C + G; \lambda \in \mathbb{C}\}$ is regular when a $\lambda_0$ from $\mathbb{C}$ exists such that $$\det(\lambda_0 C + G) \neq 0 \tag{13}$$

applies.

Consistent starting values ($x_{det}(t_0)$, $\dot{x}_{det}(t_0)$) can be acquired in that a DC operating point of the system, which is described by (12), is defined, i.e., $\dot{x}_{det}=0$ is set. NB. J. Leimkuhler et al., Approximation methods for the consistent initialization of differential-algebraic systems of equations, SIAM J. Numer. Anal., Vol. 28, pp. 205–226, 1991 ("Leimkuhler") discloses a further method for determining consistent starting values ($x_{det}(t_0)$, $\dot{x}_{det}(t_0)$).

After a transformation, which is described below, one arrives at rules that are equivalent to rule(11) and have the following form:

$$y^{\cdot [1]} + F_1 \cdot y^{[1]} + F_2 \cdot y^{[2]} + \sigma^{[1]} + (\tilde{B}(t) \cdot v(\omega, t))^{[1]} = 0 \tag{14}$$

and $$F_3 \cdot y^{[1]} + F_4 \cdot y^{[2]} + \sigma^{[2]} + (\tilde{B}(t) \cdot v(\omega, t))^{[2]} = 0 \tag{15}$$

with transformed starting conditions $$y^{[1]} \det(t_0) := (T^{-1} \cdot x_{det}(t_0))^{[1]}, \tag{16}$$

$$\dot{y}^{[1]} \det(t_0) := (T^{-1} \cdot \dot{x}_{det}(t_0))^{[1]} \tag{17}$$

and $$y^{[2]} \det(t_0) := (T^{-1} \cdot x_{det}(t_0))^{[2]}, \tag{18}$$

$$\dot{y}^{[2]} \det(t_0) := (T^{-1} \cdot \dot{x}_{det}(t_0))^{[2]} \tag{19}$$

and with $$\tilde{B}(t) := S \cdot B(t). \tag{20}$$

A prescribable matrix is respectively referenced with $F_i$, i=1, 2, 3, 4.

The goal of the transformation is to convert the rule (11) into a semi-explicit differential equation system of the type of rules (14) and (15) in the variable $y=(y^{[1]}, y^{[2]})^T$ with suitable matrices Fi and a functions $\sigma=(\sigma^{[1]}, \sigma^{[2]})^T$.

Two regular matrices S and T are found thereto for matrix C from (11) that the rule $$S \cdot C \cdot T = \text{blockdiag}(I, N) \tag{21}$$

is satisfied, where I references a unit matrix having the dimension r, and N references a zero matrix having the dimension (n−r).

On the basis of Gauss elimination with complete pivot strategy, two regular matrices $P_1$ and $Q_1$ are determined with $$P_1 \cdot C \cdot Q_1 = C_1, \tag{22}$$

where a matrix $C_1$ is a right upper triangle matrix whose r first diagonal elements are unequal to the value zero. Beginning from the $(r+1)^{st}$ line inclusive, the matrix $C_1$ has only entries with the value zero. The matrix $Q_1$ is selected as an orthogonal column-permutation matrix. The matrix $P_1$ is the product of a lower left triangle matrix and an orthogonal row-permutation matrix.

Due to a multiplication by a regular upper right triangle matrix $M_1$ from the right, all entries of the matrix $C_1$ above its diagonals are eliminated:

$$C_2 := C_1 \cdot M_1 = \text{diag}\left(\lambda_1, \ldots, \lambda_m, \underbrace{0, \ldots, 0}_{(n-r)-\text{times}}\right). \tag{23}$$

Due to a multiplication by a regular diagonal matrix $M_2$ from the left, all non-disappearing diagonal elements of the matrix $C_2$ are transformed to the value 1:

$$C_3 := M_2 \cdot C_2 = \text{diag}\left(\underbrace{1, \ldots, 1}_{r-\text{times}}, \underbrace{0, \ldots, 0}_{(n-r)-\text{times}}\right). \tag{24}$$

The matrices $S := M_2 \cdot P_1$ and $T := Q_1 \cdot M_1$ perform, the necessary function.

By setting $y := T^{-1} \cdot x$, $E := C_3 = S \cdot C \cdot T$, $F := S \cdot G \cdot T$ and $\sigma = S \cdot \sin$ rule (11), $$E \cdot \dot{y} + F \cdot y + \sigma + \tilde{B} \cdot v = 0 \tag{25}$$

derives.

In order to exploit the specific structure of the matrix $C_3$, y is divided into a first vector $y^{[1]}$ that contains the first r components and into a second vector $y^{[2]}$ that contains the remaining (n−r) entries:

$$y = (y^{[1]}, y^{[2]})^T. \tag{26}$$

The matrix F is divided into 4 sub-matrices $F_i$, i=1, 2, 3, 4 having the dimensions r×r, r×(n−r), (n−r)×r, (n−r)×(n−r):

$$F = \left(\begin{array}{c|c} F_1 & F_2 \\ \hline F_3 & F_4 \end{array}\right). \tag{27}$$

A corresponding division is selected for the matrix E.

The matrix $E_1$ is a unit matrix having the dimension r×r, and the matrices $E_2$, $E_3$ and $E_4$ are zero matrices. (25) thus resolves into the two rules (14) and (15).

When the matrix can be inverted, which is precisely the case when the system from rule (12) has the index 1, then rule (15), $$F_3 \cdot y^{[1]} + F_4 \cdot y^{[2]} + \sigma^{[2]} + (\tilde{B}(t) \cdot v(\omega, t))^{[2]} = 0 \tag{15}$$

can be solved for $y^{[2]}$, which leads to the following rule:

$$y^{[2]} = -F_4^{-1} \cdot \{F_3 \cdot y^{[1]} + \sigma^{[2]} + (\tilde{B}(t) \cdot v(\omega, t))^{[2]}\}. \tag{28}$$

The following, abbreviating terms are introduced below:

$$\hat{F} := F_1 - F_2 \cdot F_4^{-1} \cdot F_3; \tag{29}$$

$$\hat{S} := \sigma^{[1]} - F_2 \cdot F_4^{-1} \cdot \sigma^{[2]}; \tag{30}$$

$$\hat{B}(t, x) := (I_r, -F_2 \cdot F_4^{-1})^T \cdot \tilde{B}(t). \tag{31}$$

$I_r$ references a unit matrix having the dimension r, i.e., the rank of the matrix C.

Inserting rule (28) into rule (14), produces:

$$\dot{y}^{[1]} + \hat{F} \cdot y^{[1]} \hat{S} + \hat{B}(t) \cdot v(\omega, t) = 0. \tag{32}$$

Rule (32) can be interpreted as a stochastic differential equation system having the following form:

$$dY_t^{[1]} = Y_{t_0}^{[1]} - \{\hat{F} \cdot Y_t^{[1]} \cdot \hat{s}\}dt - \hat{B}(t)dW_t. \quad (33)$$

A random variable with an anticipation value $$y_{det}^{[1]}(t_0)$$

that exhibits a finite variance is reference $$Y_{t_0}^{[1]} \cdot \{W_t; t \in \mathbb{R}_0^+\}$$

is a Wiener-Hopf process having the dimension of the number of noise sources, generally the number of disturbing sources.

The method from [2] proceeds from rule (33) whose unambiguous solution process $Y_t^{[1]}$ is established as Itô differential by the equation $$Y_T^{[1]} = \Phi_{t,t_0} \cdot Y_{t_0}^{[1]} - \left( \int_{[t_0,t]} \Phi_{t,u} \cdot \hat{s}(u)d\lambda(u) + \int_{t_0}^t \Phi_{t,u} \cdot \hat{B}(u)dW_u \right) \quad (34)$$

with the fundamental system of solutions $$\Phi_{t,t_0} = \exp\left(-\int_{[t_0,t]} \hat{F}d\lambda(u)\right) = \exp\{(t_0 - t)\hat{F}\} \quad (35)$$

Given the method from [2], the anticipation values $E_t$ and the second moments $P_t$ of the random variables $Y_t^{[1]}$ are approximately determined. The anticipation value of an Itô integral is equal to the value 0. Thus, $$E_t := E(Y_t^{[1]}) = \Phi_{t,t_0} \cdot y_{det}^{[1]}(t_0) - \int_{[t_0,t]} \Phi_{t,u} \cdot \hat{s}(u)d\lambda(u) \quad (35)$$

is directly obtained from rule (34)

For all t, $E_t$ solves the ordinary differential equation system $$x_{t_0} = y_{det}^{[1]}(t_0). \quad (36)$$

For all t, the second moments $$P_t = E\{(Y_t^{[1]})^2\} \quad (37)$$

of the random variables $Y_t^{[1]}$ of the solution process satisfy the differential equation $${}^{P}\!/_{dt} = -F \cdot P_t - P_t \cdot F^T - \hat{s} \cdot E_t^T - E_t \cdot \hat{s}^T + \hat{B}(t) \cdot (t)^T, \quad (38)$$

where a starting condition is established by $$P_{t_0} = E\{Y_{t_0}^{[1]} \cdot (Y_{t_0}^{[1]})^T\} \quad (39)$$

(38) is a matter of a linear ordinary differential equation system.

Parallel to the transient simulation of the circuit, the anticipation values $E_t$ and the second moments $P_t$ are approximately determined in the method from [2] by numerical integration with linear, implicit multi-step methods.

One disadvantage of this method is that linear equation systems of the quadratic order must be solved in the plurality m of the noise sources for each time step for determining the second moments $P_t$.

This method is based on a manual index reduction of the differential-algebraic equation system to an explicit, stochastic differential equation system that cannot be automated. Moreover, only some of the noise effects are considered. Furthermore, this method does not supply any path-wise information but only the moments of the node potentials that are preserved in the index reduction. This method supplies no information for the node potentials that are suppressed by the index reduction.

A further disadvantage of the method found in Demir is that the index reduction in this method is extremely inefficient and can also not be automatically implemented, particularly since the algebraic variables are not taken into consideration in the differential-algebraic equation system. Given the method from Demir, the index reduction must be analytically manually carried out since the numerical methods are not stable.

It is also known from L. O. Chua and P. M. Lin, Computer aided design of electronic circuits, Prentice Hall, Englewood Cliffs, 1975, ISBN 0-13-165415-2, p. 596 ("Chua") to implement a noise simulation of an integrated circuit in the frequency domain, but this results in a circuit that can only be analyzed in the small signal area and the prerequisite of a fixed operating point, is frequently not established. For example, the resonant behavior of an oscillator in a circuit prevents a uniform operating point. W. Nagel, SPICE2—a computer program to simulate semiconductor circuits, Tech. Report, UC Berkeley, Memo ERL-M 520, 1975 ("Nagel") circuit can be described in a form that can be processed by a computer. P. E. Kloeden and E. Platen, Numerical (I solution of stochastic differential equations, Springer Verlag, Berlin, N.Y., ISBN 3-540-54062-8, p.412, 1992 ("Kloeden") discloses a method for the numerical handling of a stochastic differential equation system, the path-wise simulation of discrete approximations in the solution process, that is referred to as the Runge-Kutta strategy.

U.S. Pat. No. 5,646,869 discloses a simulator that comprises an initialization unit, an incrementing unit, a unit for updating an estimated value, and an output unit.

An initialization value of a status and of a function with which a system that is subject to a random disturbance is described; this value is supplied from the initialization unit to the incrementing unit. The incrementing unit employs two random number sequences in order to form an increment of the estimated value without differentiating the function itself. The estimated value is incremented by the increment in the unit for updating an estimated value.

Furthermore, U.S. Pat. No. 5,132,897 discloses a method as well as an apparatus for improving the precision of a system controlled in a closed control circuit, in which at least two stochastic noise signals are taken into consideration.

SUMMARY OF THE INVENTION

The invention is thus based on providing a method which avoids the above disadvantages.

For the inventive method, a technical system that is subject to a malfunction is described with an implicit stochastic differential equation system (SDE) exhibiting the form $C*\dot{x}(t)+G*x(t)+s(t)+B*v(t)=0$, where C references a first matrix, x(t) references a derivation of a status of the system after a time that is described by a time variable t, G references a second matrix, s(t) references a system function of independent system quantities, B references a third matrix and v(t) references a noise function. An approximate solution of this system is determined in that a discrete approximation process is realized. The discrete approximation process is realized according to the following rule:

$$-(C+h\alpha_2 G)\cdot \tilde{X}_{\pi_{n+1}}=\{-(1-\gamma)C+h(1+\gamma\alpha_1-\alpha_2)G\}\cdot \tilde{X}_{\pi_n}+$$

$$+\{-\gamma C+h(\gamma-\alpha_1\gamma)G\}\cdot \tilde{X}_{\pi_{n+1}}$$

$$+h\alpha_2 s(\pi_{n+1})+h(1+\gamma\alpha_1-\alpha_2)s(\pi_n)+$$

$$+h(\gamma-\alpha_1\gamma)s(\pi_{n-1})+$$

$$+B(\pi_n)\cdot \Delta W_n+\gamma B(\pi_n)\cdot \Delta W_{n-1}$$

C is a first matrix

α1, α2, γ are predetermined parameters from the interval [0, 1], $$h:=\frac{T}{N},$$

is a step width in an output time interval [0, T], whereby T is a predetermined value that is subdivided into N sub-intervals, G is a second matrix, $\tilde{X}_{\pi_{n+1}}$ is a realization of the approximation process at a supporting point $\pi_{n+1}$, $\tilde{X}_{\pi_{n-1}}$ is a realization of the approximation process at a supporting point $\pi_{n-1}$, $S(\pi_{n+1})$ is a realization of the approximation process at a supporting point $\pi_{n+1}$, $S(\pi_{n-1})$ is a first value at the supporting point $\pi_{n-1}$, $\Delta W_{n-1}:=W_{\pi_n}-W_{\pi_{n-1}}$ is a difference value between a second value $W_{\pi_n}$ at the supporting point $\pi_n$ and the second value $W_{\pi_{n-1}}$ at the supporting point $\pi_{n-1}$, $B(\pi_n)$ is a second value at the supporting point $\pi_n$, and where the disturbance $\tilde{X}_{\pi_{n+1}}$ is determined by an iterative solution of the approximation process.

The inventive apparatus comprises a processor unit that is configured such that a technical system that is subject to a malfunction is described with an implicit stochastic differential equation system of the form $C*\dot{x}(t)+G*x(t)+s(t)+B*v(t)=0$, where C references a first matrix, $\dot{x}(t)$ references a derivation of a status of the system after a time that is described by a time variable t, G references a second matrix, s(t) references a system function of independent system quantities, B references a third matrix and v(t) references a noise function. An approximate solution of this system is determined in that a discrete approximation process is realized. The discrete approximation process is realized according to the following rule:

$$-(C+h\alpha_2 G)\cdot \tilde{X}_{\pi_{n+1}}=\{-(1-\gamma)c+h(1+\gamma\alpha_1-\alpha_2)G\}\cdot \tilde{X}_{\pi_{n-1}}+$$

$$+\{-\gamma C+h(\gamma-\alpha_1\gamma)G\}\cdot \tilde{X}_{\pi_{n+1}}$$

$$+h\alpha_2 s(\pi_{n+1})+h(1+\gamma\alpha_1-\alpha_2)s(\pi_n)+$$

$$+h(\gamma-\alpha_1\gamma)s(\pi_{n-1})+$$

$$+B(\pi_n)\cdot \Delta W_n+\gamma B(\pi_n)\cdot \Delta W_{n-1}$$

where the following connotations apply:

C is a first matrix

α1, α2, γ are predetermined parameters from the interval [0, 1], $$h:=\frac{T}{N},$$

is a step width in an output time interval [0, T], whereby T is a predetermined value that is subdivided into N sub-intervals, G is a second matrix, $\tilde{X}_{\pi_{n+1}}$ is a realization of the approximation process at a supporting point $\pi_{n+1}$, $\tilde{X}_{\pi_n}$ is a realization of the approximation process at a supporting point $\pi_n$, $\tilde{X}_{\pi_{n-1}}$ is a realization of the approximation process at a supporting point $\pi_{n-1}$, $S(\pi_{n-1})$ is a first value at the supporting point $\pi_{n+1}$, $S(\pi_n)$ is a first value at the supporting point $\pi_n$, $S(\pi_{n-1})$ is a first value at the supporting point $\pi_{n-1}$, $\Delta W_{n-1}:=W_{\pi_n}-W_{\pi_{n-1}}$ is a difference value between a second value $W_{\pi_n}$ at the supporting point $\pi_n$ and the second value $W_{\pi_{n-1}}$ at the supporting point $\pi_{n-1}$, $B(\pi_n)$ is a second value at the supporting point $\pi_n$. The disturbance $\tilde{X}_{\pi_{n+1}}$ is determined by an iterative solution of the approximation process.

The invention directly employs the implicit structure of the technical system, represented by an implicit differential equation system. As a result of the invention, the determination of the malfunction is considerably accelerated, since the thin occupancy of the matrices C and G can be exploited. The numerically unstable and involved transformation of the differential equation system into the decoupled form is eliminated.

The invention makes it possible for the first time to also determine a malfunction given a singular matrix C.

Other advantageous embodiments include the inventive method (and an apparatus for implementing the method), where the malfunction is noise which the system is subjected to, or where the malfunction is purely additive. A method may also be implemented where the malfunction is determined path-wise. A further step of interpolating realizations of the approximation process may be used to determine a steady approximation process $\{\tilde{X}_s; s\in[0, T]\}$. Identified paths determined path-wise may be analyzed with a statistical method. This method may be used where the system is an electrical circuit, a mechanical multi-member system, a physical system, a chemical system, or a physical-chemical system.

The invention can be utilized whenever a technical system is disturbed and can be described by a system of differential-algebraic equations.

For example, disturbances (noise) in an electrical circuit can be determined. The invention is also suitable for employment in a mechanical multi-member system or in a general physical system, a chemical system or a physical-chemical system as well whose respective modeling leads to a system of differential-algebraic equations.

BRIEF DESCRIPTION OF THE DRAWINGS

Without limitation of the universal validity, the invention is described below on the basis of an exemplary embodiment of a noise simulation in an electrical circuit that is shown in the Figures.

DESCRIPTION OF THE PREFERRED EMBODIMENTS

Figure 2:
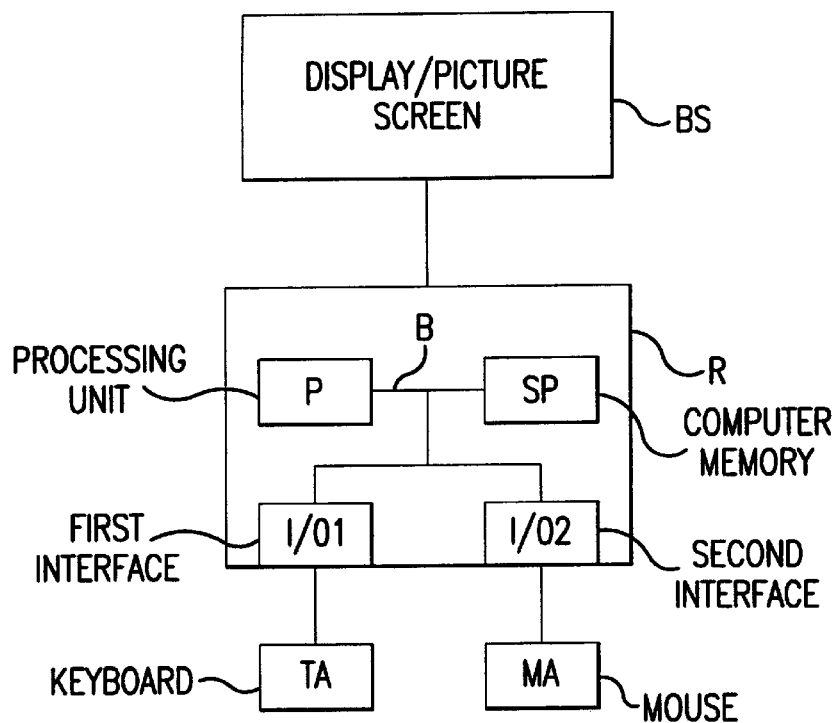
FIG. 2 is a block diagram illustrating an apparatus with which the method is implemented.

A computer R with which the method described below is implemented is shown in FIG. 2 in the form of a block diagram. The computer R comprises a processing unit P that is configured to implement the method steps described below. The processor unit P is connected via a bus B to a memory SP. The computer R is connected via a first interface I/O 1 to a keyboard TA and via a second interface I/O 2 to a mouse MA with which a user of the computer R can respectively receive input. Furthermore the computer R is connected to a picture screen BS on which results of the method are displayed for the user.

The circuit S (see FIG. 3) to be analyzed is stored in the memory SP in the form of a circuit description language. The network list format of SPICE may be utilized as circuit description language.

Figure 3:
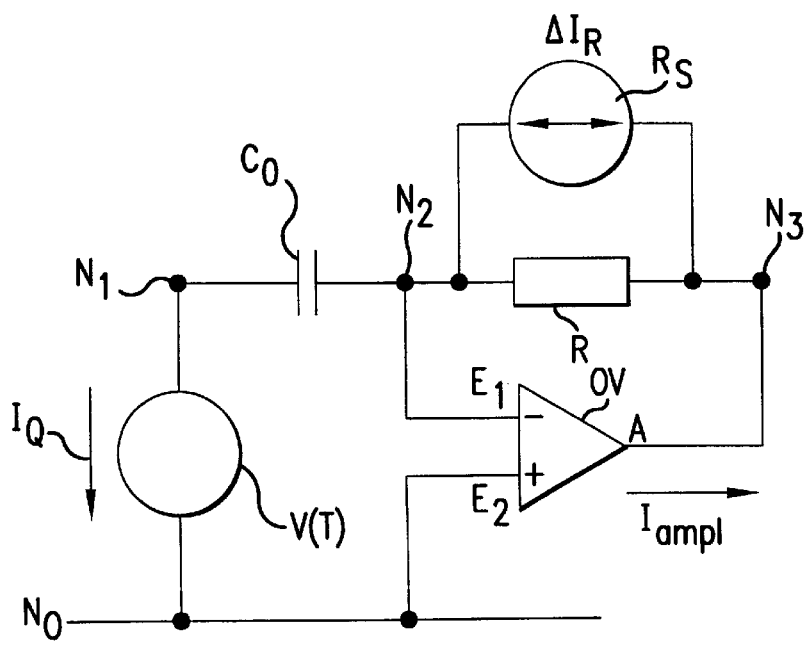
FIG. 3 is a schematic diagram of an electrical circuit of a differentiator.

An equivalent circuit diagram of the circuit S for this exemplary embodiment is shown in FIG. 3. The circuit S represents a differentiator in terms of its functionality. An independent voltage source V(t) is arranged between a first node $N_1$ and a ground potential $N_0$. A capacitance $C_0$ is provided between the first node $N_1$ and a second node $N_2$. The second node $N_2$ is connected to a third node $N_3$ via a resistor R. Additionally a noise current source RS with the current intensity $\Delta I_R$ that is connected parallel to the resistor R is provided for modeling a thermal noise in the resistor R. A first input E1 of an operational amplifier OV is connected to the second node $N_2$; a second input E2 of the operational amplifier OV is connected to the ground potential $N_0$. An output A of the operational amplifier OV is connected to the third node $N_3$.

Figure 1:
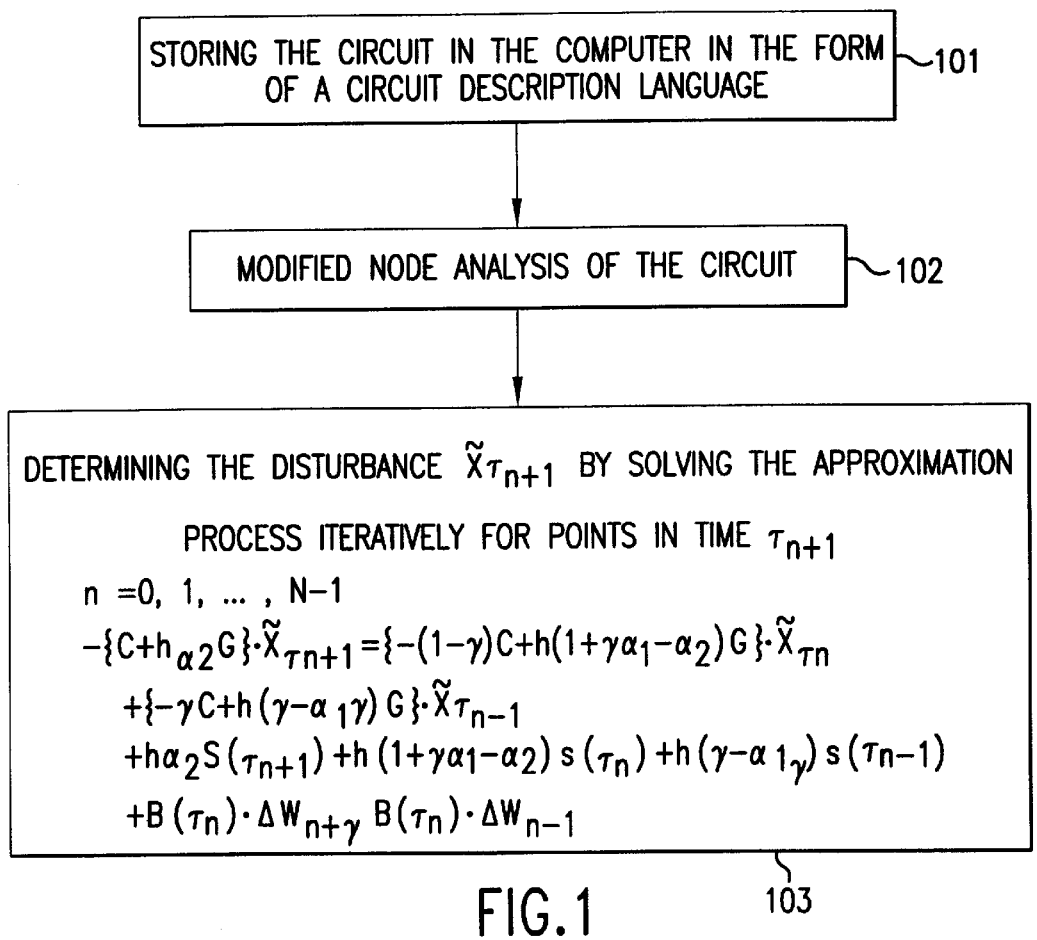
FIG. 1 is a flow chart wherein the individual method steps are shown.

In a first step 101, the circuit S is stored in the memory SP in the form of the network list format such as SPICE (see FIG. 1).

In a second step 102, a modified node analysis is implemented for the circuit S. The result of the modified node analysis is the equation system belonging to the circuit S.

In matrix notation, the linear-implicit differential equation system of the index 1 with purely additive disturbance $$\begin{pmatrix} c_0 & -c_0 & 0 & 0 & 0 \\ -c_0 & c_0 & 0 & 0 & 0 \\ 0 & 0 & 0 & 0 & 0 \\ 0 & 0 & 0 & 0 & 0 \\ 0 & 0 & 0 & 0 & 0 \end{pmatrix} \begin{pmatrix} \dot{u}_1 \\ \dot{u}_2 \\ \dot{u}_3 \\ \dot{I}_Q \\ \dot{I}_{ampl} \end{pmatrix} ++$$

-continued $$\begin{pmatrix} 0 & 0 & 0 & 1 & 0 \\ 0 & \frac{1}{R} & -\frac{1}{R} & 0 & 0 \\ 0 & -\frac{1}{R} & \frac{1}{R} & 0 & -1 \\ 0 & A & 1 & 0 & 0 \\ 1 & 0 & 0 & 0 & 0 \end{pmatrix} \begin{pmatrix} u_1 \\ u_2 \\ u_3 \\ I_Q \\ I_{ampl} \end{pmatrix} ++ \begin{pmatrix} 0 \\ \sqrt{\frac{4kT}{R}\Delta f} \\ -\sqrt{\frac{4kT}{R}\Delta f} \\ 0 \\ 0 \end{pmatrix} \cdot v(t,\omega) = \begin{pmatrix} 0 \\ 0 \\ 0 \\ 0 \\ v(t) \end{pmatrix}$$

derives for the circuit S, in which, $u_1, u_2, u_3$ are the voltages at the respectives nodes $N_1, N_2, N_3$, $I_Q$ is the current flowing through the first node $N_1$ and through the voltage source V(t), $I_{amp}$ is the current flowing through the third node $N_3$ and the operational amplifier OV, R is the resistance value of the resistor R, $C_0$ is the capacitance value of the capacitor $C_0$, A is a gain factor of the operational amplifier OV.

In the model of the thermal noise, the current intensity $\Delta I_R$ of the current that flows through the noise current source RS is defined by the equation $$\Delta I_R = \sqrt{\frac{4kT}{R}\Delta f} \cdot v(\omega, t) \tag{40}$$

As white noise, $v(\omega, t)$ describes the driving, generalized stochastic process, i.e., the malfunction of the technical system. The quantities k, T and $\Delta f$ are prescribed as constants.

In general, thus, a non-decoupled linear-implicit differential equation system with purely additive stochastic disturbance (noise) having the following form derives:

$$C \cdot \dot{x}(t) + G \cdot x(t) + s(t) + B(t) \cdot v(\omega, t) = 0. \tag{41}$$

It is assumed for the derivation of the method but not for the method itself that the capacitance matrix C can be inverted.

By multiplication of Equation (41) by the inverse capacitance matrix $C^{-1}$, one obtains $$\dot{x}(t) = -C^{-1} \cdot \{G \cdot x(t) + s(t) - C^{-1} \cdot B(t, x(t)) \cdot v(\omega, t) = 0. \tag{42}$$

Rule (42) is interpreted as stochastic differential equation system having the form $$dX_t = X_{t_0} - C^{-1} \cdot \{G \cdot X_t + s\} dt - C^{-1} \cdot B(t) dW_t \tag{43}$$

where $X_{t_0}$ references a random variable with anticipation value $x_{det}(t_0)$.

The following method, which is described in Kloeden, is applied to the differential equation system (37) (the method is referred to as the implicit strong two-step method of the order 1 for a stochastic differential equation system).

For every natural number N, a numerical method supplies realizations of a discrete approximation process $\{\tilde{X}_s; s=\pi_0, \ldots, \pi_n\}$ in that it calculates approximations $\tilde{X}(\omega, \pi_i)$ for the values $X(\omega, \pi_i)$ from $\Omega$ at the respective supporting points $\pi_i$ for a given $\omega$.

In order to obtain a steady approximation process $\{\tilde{X}_s; s \in [0, T]\}$, the obtained values are interpolated, for example, linearly item-by-item. The paths that result can be subsequently analyzed with statistical methods.

Kloeden recites the following family of implicit, strong two-step methods of the order 1 for determining the components k of the realizations $\{\tilde{X}_{\pi_i}; i=0, \ldots, N\}$:

$$\tilde{X}_{n+1}^k = (1-\gamma_k)\tilde{X}_n^k + \gamma_k \tilde{X}_{\tau_{n-1}}^k + \quad (44)$$

$$h \begin{Bmatrix} \alpha_{2,k} f^k(\tau_{n+1}, \tilde{X}_{\tau_{n+1}}) + (1+\gamma_k \alpha_{1,k} - \alpha_{2,k}) f^k + \\ \gamma_k(1-\alpha_{1,k}) f^k(\tau_{n-1}, \tilde{X}_{\tau_{n-1}}) \end{Bmatrix} +$$

$$V_n^k + \gamma_k V_{n-1}^k$$

A function without arguments thereby stands for an evaluation at the point $(\pi_n, \tilde{X}_{\pi_n})$.

The real parameters $\alpha_{1,k}$, $\alpha_{2,k}$ and $\gamma_k$ are selected from the interval [0, 1]. Furthermore, the quantity $$V_n^k$$

is established by $$V_n^k = \sum_{j=1}^m g^{k,j} \Delta W_n^j + \sum_{j_1, j_2}^m L^{j_1} g^{k,j_2} I_{(j_1, j_2), \tau_n, \tau_{n+1}}, \quad (45)$$

where $$\Delta W_n := W_{\pi_{n+1}} - W_{\pi_n} \quad (46)$$

describes the increases of the Wiener process and $L^j$ is an abbreviated notation for the operator $$L^j := \sum_{k=1}^d g^{k,j} \frac{\partial}{\partial x^k}, \quad j = 1, \ldots, m \quad (47)$$

The quantity $I(j_1, j_2), \pi_n, \pi_{n+1}$ describes the multiple Itô integral $$I_{(j_1, j_2), \tau_n, \tau_{n+1}} := \int_{\tau_n}^{\tau_{n+1}} \int_{\tau_n}^{s_2} dW_{s_1}^{j_1} dW_{s_2}^{j_2}. \quad (48)$$

h is established by the rule $$h := \frac{T}{N}. \quad (49)$$

When the parameters $\alpha_{1,k}$, $\alpha_{2,k}$ and $\gamma_k$ are selected for all $k=1, \ldots, n$, then rule (44) for the case of purely additive disturbance is simplified in vector notation to $$\tilde{X}_{n+1}^k = (1-\gamma)\tilde{X}_n + \gamma \tilde{X}_{\tau_{n-1}} + \quad (50)$$

$$h \begin{Bmatrix} \alpha_2 f(\tau_{n+1}, \tilde{X}_{\tau_{n+1}}) + (1+\gamma\alpha_1 - \alpha_2) f + \\ \gamma(1-\alpha_1) f(\tau_{n-1}, \tilde{X}_{\tau_{n-1}}) \end{Bmatrix}, +$$

$$g \cdot \Delta W_n + \gamma g \cdot \Delta W_{n-1}$$

since the function g is dependent only on the time. Rule (50) is applied to the differential equation system (43).

The following thus derives:

$$\tilde{X}_{\tau_{n+1}} = (1-\gamma)\tilde{X}_{\tau_n} + \gamma \tilde{X}_{\tau_{n-1}} - \quad (51)$$

$$h \begin{Bmatrix} \alpha_2 C^{-1}(G \cdot \tilde{X}_{\tau_{n+1}} + s(\tau_{n+1})) + \\ (1+\gamma\alpha_1 - \alpha_2) C^{-1}(G \cdot \tilde{X}_{\tau_n} + s(\tau_n)) + \\ (\gamma - \alpha_1\gamma) C^{-1}(G \cdot \tilde{X}_{\tau_{n-1}} + s(\tau_{n-1})) \end{Bmatrix} -$$

$$C^{-1} B(\tau_n) \Delta W_n - \gamma C^{-1} B(\tau_n) \Delta W_{n-1}$$

In the next step, (40) is multiplied by $-C$.

The following thus derives:

$$-C\{\tilde{X}_{\tau_{n+1}} - (1-\gamma)\tilde{X}_{\tau_n} - \gamma \tilde{X}_{\tau_{n-1}}\} = \quad (52)$$

$$h \begin{bmatrix} \alpha_2\{G \cdot \tilde{X}_{\tau_{n+1}} + s(\tau_{n+1})\} + \\ (1+\gamma\alpha_1 - \alpha_2)\{G \cdot \tilde{X}_{\tau_n} + s(\tau_n)\} + \\ (\gamma - \alpha_1\gamma)\{G \cdot \tilde{X}_{\tau_{n-1}} + s(\tau_{n-1})\} \end{bmatrix}, + B(\tau_n) \cdot \Delta W_n +$$

$$\gamma B(\tau_n) \cdot \Delta W_{n-1}$$

By combining the terms in $\tilde{X}_{\pi_{n+1}}$ on the right side of (41), the following derives:

$$-(C+h\alpha_2 G) \cdot \tilde{X}_{\pi_{n+1}} = \{-(1-\gamma)c + h(1+\gamma\alpha_1 - \alpha_2)G\} \cdot \tilde{X}_{\pi_n} +$$

$$+\{-\gamma C + h(\gamma - \alpha_1\gamma)G\} \cdot \tilde{X}_{\pi_{n+1}}$$

$$+h\alpha_2 s(\pi_{n+1}) + h(1+\gamma\alpha_1 - \alpha_2)s(\pi_n) +$$

$$+h(\gamma - \alpha_1\gamma)s(\pi_{n-1}) +$$

$$+B(\pi_n) \cdot \Delta W_n + \gamma B(\pi_n) \cdot \Delta W_{n-1} \quad (53)$$

For the case of the index 0, rule (53) recites a rule with which the disturbance of the system can be determined. Rule (53) can also be applied in the case of the index 1.

The disturbance $\tilde{X}_{\pi_{n+1}}$ is determined in a further step 103 by iterative solution of the approximation process. The determination of the disturbance $\tilde{X}_{\pi_{n+1}}$ is iteratively implemented in a loop, for example, n=0, 1, . . . , N−1, as a result of which the curve of the disturbance $\tilde{X}_{\pi_{n+1}}$ at the respective points in time $\pi_n$ is determined.

A circuit S is modified dependent on the identified disturbance, so that the prescribable conditions, for example, in view of the noise susceptibility of the circuit S, are met.

The modified circuit is burned in silicon in a last step.

Figure 4:
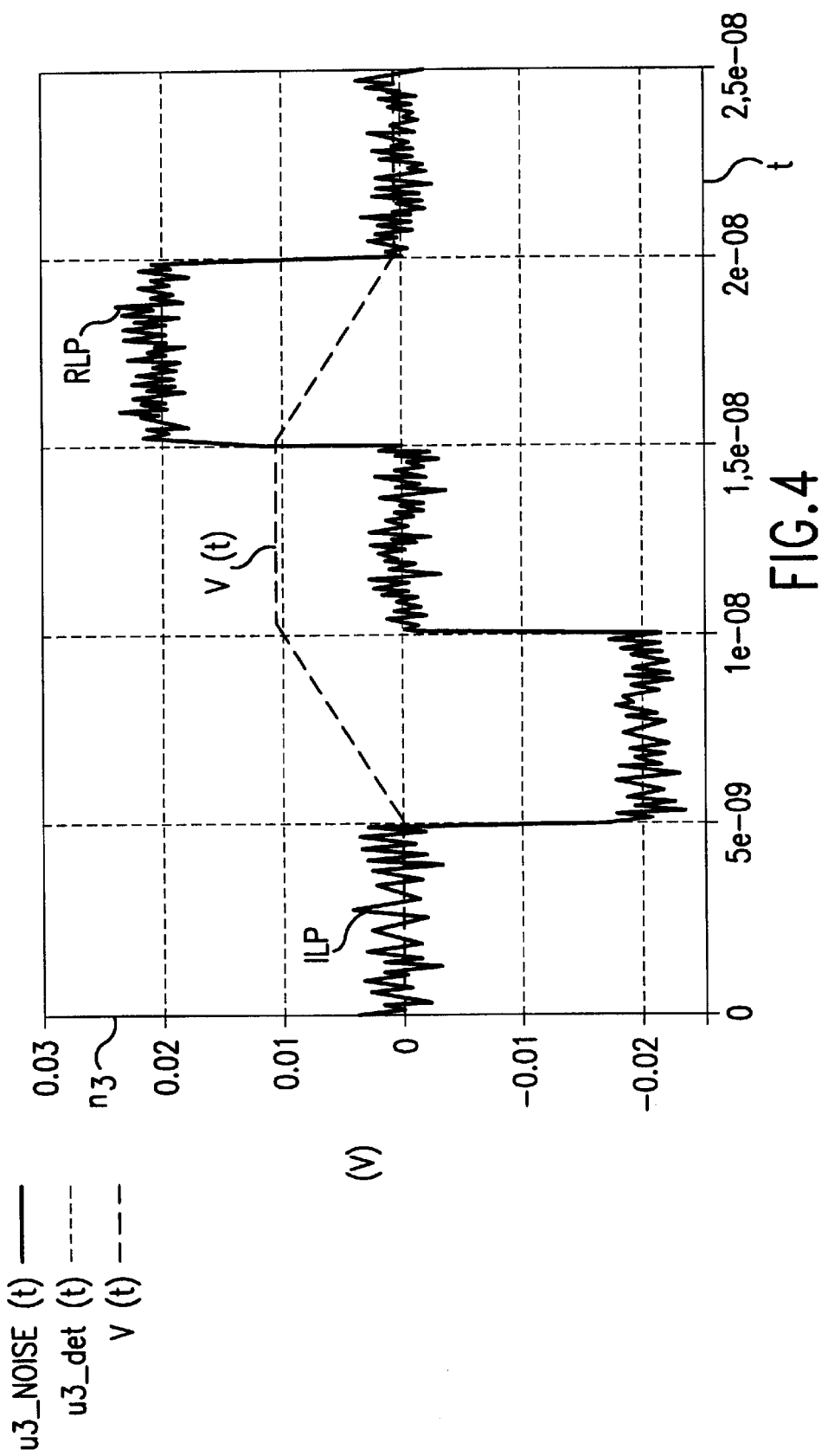
FIG. 4 is a graph illustrating of a simulation result.

As result, FIG. 4 is a graph showing the method implemented by the computer R, this being indicated below as a program. What is shown is a numerically simulated solution path RLP of the voltage curve in the third node $N_3$ taking the noise into consideration. For comparison, the ideal solution path ILP, i.e., the solution path without taking the noise into consideration, is also indicated. The curve V of the input quantity V(t) is also shown.

The following parameters were employed for the method:

$$\Delta = 2.5 \cdot 10^{-11} \ [s]$$

$$V(t) = \begin{cases} 0 & \text{for } 0 \le t \le 5 \cdot 10^{-9} \\ 2 \cdot 10^6 \cdot t - 1 \cdot 10^{-2} & \text{for } 5 \cdot 10^{-9} < t \le 10 \cdot 10^{-9} \\ 1 \cdot 10^{-2} & \text{for } 10 \cdot 10^{-9} < t \le 15 \cdot 10^{-9} \quad [V] \\ -2 \cdot 10^6 \cdot t + 4 \cdot 10^{-2} & \text{for } 15 \cdot 10^{-9} < t \le 20 \cdot 10^{-9} \\ 0 & \text{for } 20 \cdot 10^{-9} < t \le 25 \cdot 10^{-9} \end{cases}$$

$$C_0 = 1 \cdot 10^{-12} \text{ [F]}$$

$$R = 1 \cdot 10^4 \text{ [}\Omega\text{]}$$

$$\Delta f = 1 \text{ [Hz]}$$

A few modifications generalizations of the above-described exemplary embodiment are presented below:

The capacitance matrix can also be singular without additional effort. For the first time, thus, it is also possible to take a singular capacitance matrix into consideration.

Also, further methods described in Kloeden can be utilized for path-oriented approximation of a stochastic differential equation system in order, for example, to achieve a higher convergence order.

The invention is definitely not limited to the determination of thermal noise. On the contrary, every model of a disturbance can be taken into consideration within the framework of the invention that can be described or approximated by white noise, for example, shot noise in power sources. When taking the shot noise into consideration, the power source is modelled by a random-dependent power source connected in parallel whose current intensity $\Delta I_Q$ satisfies the rule $$\Delta I_Q = \sqrt{2eI_{det}\Delta f} \cdot v(\omega, t)$$

A realization of the method for noise simulation is recited below in FORTRAN77 programming language.

```
PROGRAM integr
C Method for the numerical solution of linear-implicit
    differential
C equation systems with purely additive disturbance.
C
    IMPLICIT NONE
    INTRINSIC dble, real
    EXTERNAL setall, gennor, dgesv, giveB, gives
    EXTERNAL a_smsm, m_mv, v_to _v, m_sv, a_vvvv
    REAL gennor
C
C Constant and variable declarations and initialization
C
    INTEGER n, m, anz, i, j, info, init1, init2
C
C n is the dimension of the system, m the plurality of the
C noise sources
C anz is the plurality of observed sub-intervals,
C i and j are auxiliary variables for loops,
C info interrogates the Return-Code C
init1 and init2 are the seeds for the
C pseudo-random number generator
C
    PARAMETER (n=5, m=1, anz=1000)
    PARAMETER (init1=23556, init2=4285979)
C
    DOUBLE PRECISION lrand, rrand, h, tauakt, alpha
C
C [lrand, rrand] references the observed interval
C h the step width, tauakt the current point in time,
C alpha the parameter value alpha2 from (53), whereby
    alpha1=0.0
C and gamma=0.0 were set.
    PARAMETER (alpha=0.9)
    PARAMETER (lrand=0.0d0, rrand=2.5d-8)
C
    DOUBLE PRECISION xakt(n), d(n), salt(n), sakt(n)
    DOUBLE PRECISION C(m,n), G(n,n), B(n,m), A(n,n)
    DOUBLE PRECISION h1_n(n), h2_n(n), h3_n(n),
        h4_n(n)
    DOUBLE PRECISION h1_m(m), h1_nn(n, n)
C
C xakt describes the value of the solution process at the point
    in time
C tauakt
C C, B and G are the matrices of the problem of the rule
C (3)
C A and d serve for the equation erection
C salt and sakt describe s(tauakt) or, respectively, s(takt-1)
C h*_* reference auxiliary vectors and matrices
C set consistent start vector
    xakt(1)=0.0d0
    xakt(2)=0.0d0
    xakt(3)=0.0d0
    xakt(4)=0.0d0
    xakt(5)=0.0d0
C
C definition of the matrix C (with capacitance=1*10^{12}
C Farad)
    C(1,1)=1.0d-12
    C(2,1)=-1.02-12
    C(3,1)=0.0d0
    C(4,1)=0.0d0
    C(5,1)=0.0d0
    C(1,2)=-1.0d-12
    C(2,2)=1.0d-12
    C(3,2)=0.0d0
    C(4,2)=0.0d0
    C(5,2)=0.0d0
    C(1,3)=0.0d0
    C(2,3)=0.0d0
    C(3,3)=0.0d0
    C(4,3)=0.0d0
    C(5,3)=0.0d0
    C(1,4)=0.0d0
    C(2,4)=0.0d0
    C(3,4)=0.0d0
    C(4,4)=0.0d0
    C(5,4)=0.0d0
    C(1,5)=0.0d0
    C(2,5)=0.0d0
    C(3,5)=0.0d0
    C(4,5)=0.0d0
    C(5,5)=0.0d0
C
C definition of the matrix G (with R1=10000, A=300})
    G(1,1)=0.0d0
    G(2,1)=0.0d0
    G(3,1)=0.0d0
```

```
      G(4,1)=0.0d0
      G(5,1)=1.0d0
      G(1,2)=0.0d0
      G(2,2)=1.0d-4
      G(3,2)=-1.0d-4
      G(4,2)=3.0d2
      G(5,2)=0.0d0
      G(1,3)=0.0d0
      G(2,3)=-1.0d-4
      G(3,3)=1.0d-4
      G(4,3)=1.0d0
      G(5,3)=0.0d0
      G(1,4)=1.0d0
      G(2,4)=0.0d0
      G(3,4)=0.0d0
      G(4,4)=0.0d0
      G(5,4)=0.0d0
      G(1,5)=0.0d0
      G(2,5)=0.0d0
      G(3,5)=-1.0d0
      G(4,5)=0.0d0
      G(5,5)=0.0d0
C
C initialize pseudo-random number generator
      CALL setall (init1, init2)
C
C calculate step width
C
      h=(rrand-lrand)/anz
C
C initialize point in time and x-value
C
      tauakt=lrand
C
C open output datafile
      OPEN(9, FILE='opmit1000', FORM='FORMATTED')
C write starting time and value into the output datafile
      WRITE(9, 42) tauakt, (xakt (i), i=1, n)
C note "old" s-value
      CALL gives (salt, n, tauakt)
C
C outer loop: corresponds to the handling of
C a sub-interval
      DO 10, i=1, anz
C constructing the system A*X=b
C
C constructing A
C A=-C-alpha*h*G
      CALL a_smsm(C, G, -1.0d0, -alpha*h, A, n, n)
C construct B
      CALL giveB(B, n, m, tauakt)
C increment time
      tauakt=tauakt+h
C construct sakt—salt exits before loop entry
      CALL gives(sakt, n, tauakt)
C note "old" s-value
      CALL v_to_v(sakt, salt, n)
C construct d
C
C h1_nn=-C+(1-alpha)*h*G
      CALL a_smsm(C, G, -1.0d0, (1-alpha)*h. h1_nn, n, n)
C h1_n=h11_nn*xakt
      CALL m_mv(h1_nn, xakt, h1_n, n, n)
C h2_n=alpha*h*sakt
      CALL m_sv(sakt, alpha*h, h2_n, n)
C h3_n=(1-alpha)*h*salt
      CALL m_sv(salt, (1-alpha)*h, h3_n, n)
C h1_m=DeltaW
      DO 20, j=1, m
         h1_m(j)=DBLE(gennor(0.0, SQRT(REAL(h))))
20    CONTINUE
C h4_n=B*h1_m
      CALL m_mv(B, h1_m, h4_n, n, m)
C d=h1_n+h2_n+h3_n+h4_n
      CALL a_vvvv(h1_n, h2_n, h3_n, h4_n, d, n)
C call the equation solver (h1_n is only a dummy)
      CALL dgesv(n, 1, A, n, h1_n, d, n, info)
C set new value of xakt
      CALL v_to_v(d, xakt, n)
C write current point in time and x-value into the output data
C file
      WRITE(9, 42) tauakt, (xakt(j), j=1, 3)
42    FORMAT(E16.6,E16.6,E16.6,E16.6,E16.6,E16.6)
10    CONTINUE
C
C close output datafile
      CLOSE(9, STATUS='keep')
      STOP
      END
C
C===
C
      SUBROUTINE giveB(outB, n, m, tauakt)
C
C supplies the value of the (n×m) matrix B in outB
C from rule (3) at time tauakt
C IMPLICIT NONE
      intrinsic DSQRT
C
C dummy arguments
      INTEGER n,m
      DOUBLE PRECISION outB(n, m), tauakt
C local variable
      DOUBLE PRECISION k, T, deltaf
C k references the Boltzmann constant, T the absolute
C temperature, deltaf the noise bandwidth
      PARAMETER(k=1.308d-23, T=300, deltaf=1.0d0)
C time-independent definition of the matrix B from Example
C 3.4
C (with R1=3000, R2=4000, R3=5000 Ohm
C T=300 K, k=1.3807*10^{-23}^jK {-1}, f=10)
C
      outB(1,1)=0.0d0
      outB(2,1)=dsqrt(4*k*T*deltaf/10000.0d0)
      outB(3,1)=-dsqrt(4*k*T*deltaf/10000.0d0)
      outB(4,1)=0.0d0
      outB(5,1)=0.0d0
      RETURN
      end
C
C===
C
      SUBROUTINE gives(outs, n, tauakt)
```

```
C
C supplies the value of the (n)-vector s
C from rule (3) in outs at time tauakt
C
C
    IMPLICIT NONE
    INTRINSIC sin
C
C dummy arguments
    INTEGER n
    DOUBLE PRECISION outs(n), tauakt
C
C local variable
    INTEGER i
C i describes the current line position of outs
    DO 10, i=1, n-1
        outs(i)=0.0d0
    CONTINUE
    IF (0.0d0 .1e. Tauakt .and. Tauakt .1e. 5.0d-9 ) THEN
        outs(n)=0.0d0
    ELSE IF (5.0d-9 .1t. tauakt .and. tauakt .1e. 10.0d-9)
    THEN
        outs(n)=-(2.0d6*tauakt -1.0d-2)
    ELSE IF (10.0d-9 .1t. tauakt .and. tauakt .1e. 15.0d-9)
    THEN
        outs(n)=-(10.0d-3)
    ELSE IF (15.0d-9 .1t. tauakt .and. tauakt .1e. 20.0d-9)
    THEN
        outs(n)=-(-2.0d6*tauakt+4.0d-2)
    ELSE IF (20.0d-9 .1t. tauakt .and. tauakt .1e. 25.0d-9)
    THEN
        outs(n)=0.0d0
    END IF
    RETURN
    END
```

The above-described method and apparatus are illustrative of the principles of the present invention. Numerous modifications and adaptions thereof will be readily apparent to those skilled in this art without departing from the spirit and scope of the present invention.

What is claimed is:

1. A method for determining a malfunction of a technical system that is subject to a malfunction, comprising the steps of:

obtaining a status of said system by a processor unit, said system being describable by an implicit stochastic differential equation system with a form $C^*(t)+G^*x(t)+s(t)+B^*v(t)=0$, wherein C references a first matrix, (t) references a derivation of said status of said system after a time that is described by a time variable t, G references a second matrix, s(t) references a system function of independent system quantities, B references a third matrix and v(t) references a noise function, determining an approximative solution of said implicit stochastic differential equation system by a discrete approximation process, wherein said discrete approximation process is operating according to a rule $$-(C+h\alpha_2 G)\cdot \tilde{X}_{\pi_{n+1}} = \{-(1-\gamma)c+h(1+\gamma\alpha_1-\alpha_2)G\}\cdot \tilde{X}_{\pi_n}$$
   $$+\{-\gamma C+h(\gamma-\alpha_1\gamma)G\}\cdot \tilde{X}_{\pi_{n+1}}$$
   $$+h\alpha_2 s(\pi_{n+1})+h(1+\gamma\alpha_1-\alpha_2)s(\pi_n)+$$
   $$+h(\gamma-\alpha_1\gamma)s(\pi_{n-1})+$$
   $$+B(\pi_n)\cdot \Delta W_n+\gamma B(\pi_n)\cdot \Delta W_{n-1}$$

wherein $\acute{a}1, \acute{a}2, \acute{a}$ are predetermined parameters from the interval [0, 1], h:=T/N, is a step width in an output time interval, whereby T is a predetermined value that is subdivided into N sub-intervals, $\tilde{X}_{\pi_{n+1}}$ is a realization of said approximation process at a supporting point $\hat{O}_{n+1}$, $\tilde{X}_{\pi_n}$ is a realization of said approximation process at a supporting point $\hat{O}_n$, $\tilde{X}_{\pi_{n-1}}$ is a realization of said approximation process at a supporting point $\hat{O}_{n-1}$, $\Delta W_{n-1}:W_{\pi_n}-W_{\pi_{n-1}}$ is a difference value between a second value $W_{\pi_n}$ at said supporting point $\hat{O}_n$ and said second value $W_{n-1}$ at said supporting point $\hat{O}_{n-1}$, and;

iteratively solving for disturbance of said approximation process.

2. A method according to claim 1, wherein said malfunction is noise to which said system is subject.

3. A method according to claim 1, wherein said malfunction is purely additive.

4. A method according to claim 1, wherein said malfunction is determined path-wise.

5. A method according to claim 1, further comprising the step of interpolating realizations of said approximation process to determine a steady approximation process $\{\tilde{X}_s; s\in[0, T]\}$.

6. A method according to claim 4, further comprising the step of analyzing identified paths determined path-wise with a statistical method.

7. A method according to claim 1, wherein said system is an electrical circuit.

8. A method according to claim 1, wherein said system is a mechanical multi-member system.

9. A method according to claim 1, wherein said system is a physical system.

10. A method according to claim 1, wherein said system is a chemical system.

11. A method according to claim 1, wherein said system is a physical-chemical system.

12. An apparatus for determining a malfunction of a technical system that is subject to a malfunction, comprising:

a processor unit, wherein said system is describable with an implicit stochastic differential equation system with a form $C^*(t)+G^*x(t)+s(t)+B^*v(t)=0$, wherein C references a first matrix, (t) references a derivation of a status of the system after a time that is described by a time variable t, G references a second matrix, s(t) references a system function of independent system quantities, B references a third matrix and v(t) references a noise function, wherein said processor unit determines an approximative solution of said implicit stochastic differential equation system by a discrete approximation process operating according to a rule $$-(C+h\alpha_2 G)\cdot \tilde{X}_{\pi_{n+1}} = \{-(1-\gamma)c+h(1+\gamma\alpha_1-\alpha_2)G\}\cdot \tilde{X}_{\pi_n}$$
   $$+\{-\gamma C+h(\gamma-\alpha_1\gamma)G\}\cdot \tilde{X}_{\pi_{n+1}}$$
   $$+h\alpha_2 s(\pi_{n+1})+h(1+\gamma\alpha_1-\alpha_2)s(\pi_n)+$$

$+h(\gamma-\alpha_1\gamma)s(\pi_{n-1})+$ $+B(\pi_n)\cdot\Delta W_n+\gamma B(\pi_n)\cdot\Delta W_{n-1}$ wherein á1, á2, á are predetermined parameters from the interval, h:=T/N, is a step width in an output time interval, whereby T is a predetermined value that is subdivided into N sub-intervals, $\tilde{X}_{\pi_{n+1}}$ is a realization of said approximation process at a supporting point $\hat{O}_{n+1}$, $\tilde{X}_{\pi_n}$ is a realization of said approximation process at a supporting point $\hat{O}_n$, $\tilde{X}_{\pi_{n-1}}$ is a realization of said approximation process at a supporting point $\hat{O}_{n-1}$, $\Delta W_{n-1}: W_{\pi_n}-W_{\pi_{n-1}}$ is a difference value between a second value $W_{\pi_n}$ at said supporting point $\hat{O}_n$ and said second value $W_{\pi_{n-1}}$ at said supporting point $\hat{O}_{n-1}$ and;

disturbance $\tilde{X}_{\pi_{n+1}}$ is determined by iterative solution of said approximation process by said processor.

13. An apparatus according to claim 12, wherein said malfunction is noise to which said system is subject.

14. An apparatus according to claim 12, wherein said malfunction is purely additive.

15. An apparatus according to claim 12, wherein said processor unit is configured such that said malfunction is determined path-wise.

16. An apparatus according to claim 12, wherein said processor unit is configured such that a steady approximation process $\{\tilde{X}_s; s\in[0, T]\}$ is determined in that identified realizations of said approximation process are interpolated.

17. An apparatus according to claim 15 wherein said processor unit is configured such that identified paths are analyzed with a statistical method.

18. An apparatus according to claim 12, wherein said system is an electrical circuit.

19. An apparatus according to claim 12, wherein said system is a mechanical multi-member system.

20. An apparatus according to claim 12, wherein said system is a physical system.

21. An apparatus according to claim 12, wherein said system is a chemical system.

22. An apparatus according to claim 12, wherein said system is a physical-chemical system.

23. A method according to claim 5, further comprising the step of analyzing identified paths determined path-wise with a statistical method.

24. An apparatus according to claim 16, wherein said processor unit is configured such that identified paths are analyzed with a statistical method.

* * * * *